United States Patent [19]

Van Elk et al.

[11] 3,753,141

[45] Aug. 14, 1973

[54] WIDE FREQUENCY RANGE VOLTAGE CONTROLLED OSCILLATOR WITH CRYSTAL CONTROLLED FREQUENCY STABILIZING LOOP

[75] Inventors: Cornelis Johannes Van Elk; Jacob Frederik Raaigever; Jan Gijsbert Morrien, all of Hilversum, Netherlands

[73] Assignee: U.S. Philips Corporation, New York, N.Y.

[22] Filed: Sept. 20, 1971

[21] Appl. No.: 182,067

[30] Foreign Application Priority Data

Sept. 24, 1970 Netherlands ....................... 7014066

[52] U.S. Cl. ..................... 331/1 A, 331/10, 331/17, 331/18, 331/25

[51] Int. Cl. ............................................ H03b 3/04

[58] Field of Search ........................ 331/1 A, 10, 11, 331/17, 18, 25

[56] References Cited

UNITED STATES PATENTS

| | | | |
|---|---|---|---|
| 3,644,840 | 2/1972 | Conner | 331/1 A |
| 3,651,422 | 3/1972 | Underhill | 331/1 A |

*Primary Examiner*—Roy Lake
*Assistant Examiner*—Siegfried H. Grimm
*Attorney*—Frank R. Trifari

[57] ABSTRACT

A controllable broad-band frequency generator comprising a voltage-controlled oscillator incorporated in a frequency controlled loop and an external controllable voltage source connected thereto, the control loop furthermore incorporating a digital crystal stable frequency discriminator and a combination device in which the direct voltage value derived from the voltage source is deducted from the output voltage provided by the frequency discriminator to obtain a direct control voltage for frequency controlling the voltage-controlled oscillator.

10 Claims, 8 Drawing Figures

Figure 1:
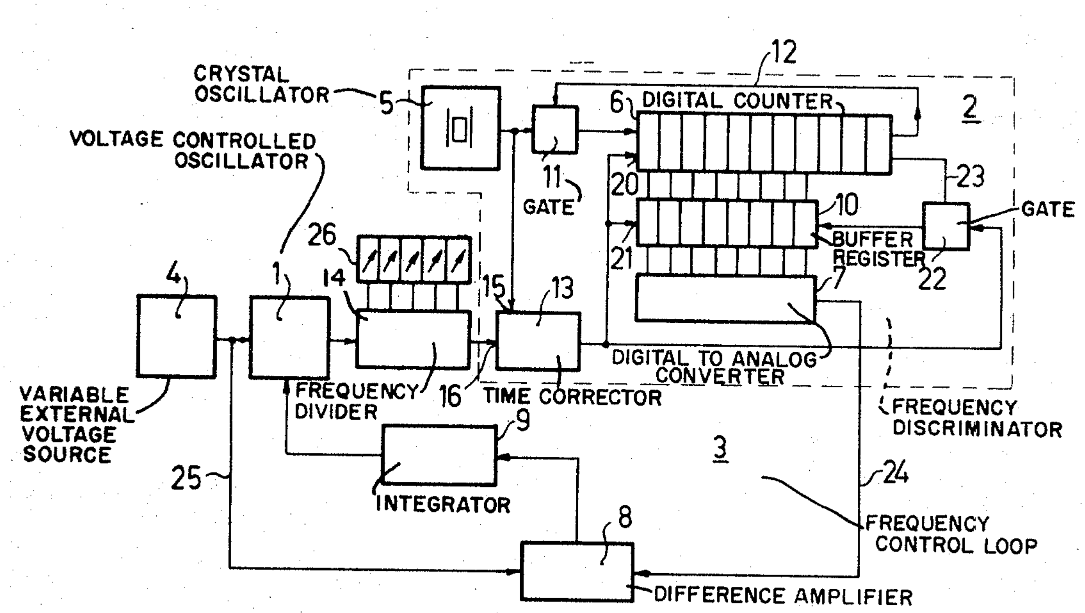

INVENTORS
CORNELIS J. VAN ELK
JACOB F. RAATGEVER
JAN G.D. VAN DER LEE
ALBERTUS M. MORRIEN
BY
Frank R. Trifari
AGENT

*INVENTORS*
CORNELIS J. VAN ELK
JACOB F. RAATGEVER
JAN G.D. VAN DER LEE
ALBERTUS M. MORRIEN
BY
AGENT

INVENTORS
CORNELIS J. VAN ELK
JACOB F. RAATGEVER
JAN G.D. VAN DER LEE
ALBERTUS M. MORRIEN
BY
AGENT

INVENTORS
CORNELIS J. VAN ELK
JACOB F. RAATGEVER
JAN G.D. VAN DER LEE
ALBERTUS M. MORRIEN
BY
AGENT

WIDE FREQUENCY RANGE VOLTAGE CONTROLLED OSCILLATOR WITH CRYSTAL CONTROLLED FREQUENCY STABILIZING LOOP

The invention relates to a controllable broad-band frequency generator comprising a voltage-controlled oscillator, a control loop including a frequency discriminator and a crystal reference for stabilizing the output frequency of said voltage controlled oscillator, an external variable voltage source, and means connecting said external source to said voltage controlled oscillator to vary the stabilized output frequency of said oscillator over a relatively large frequency range, as a function of a direct voltage value derived from said external variable voltage source. Particularly, an alternating voltage may be superimposed on the direct voltage value for modulation purposes.

Frequency generators of the type described above are known, but their utility in, for example, communicating and telemetry systems is limited, because the requirements regarding frequency stability and magnitude of the frequency variation range are very stringent. A problem occurring in the practical realization of such frequency generators is that the requirement of a large frequency variation range is opposed and hence contradictory to that of a high frequency stability as may be obtained by using a crystal reference. All known frequency generators of the above-mentioned type are based on solutions aiming at a compromise which is as favourable as possible.

An object of the present invention is to provide a frequency generator of the type described in the preamble which completely obviates the necessity of compromises so that an optimum stability and an optimum frequency variation range can be realised.

In a frequency generator of the kind described in the preamble, according to the invention, the said frequency discriminator comprises a crystal oscillator and a digital counter adapted to continuously count the output pulses from one of the said oscillators during consecutive counting cycles whose duration is determined by a gating signal derived from the output signal of the other oscillator, digital-to-analog converter connected to said counter to produce an output signal every time at the end of a counting cycle, the magnitude and polarity of said signal corresponding to the magnitude and direction of the mean value of the deviation measured during the counting cycle of the frequency to be stabilized relative to a fixed discriminator centre frequency which is characterized by a given counter content, said frequency control loop being furthermore provided with a combination device to which the output signal from the digital-to-analog converter and the direct voltage value supplied by the external source are applied so as to obtain a difference signal which after integration in an integrator is applied as a frequency correction signal to the voltage-controlled oscillator.

Figure 2:
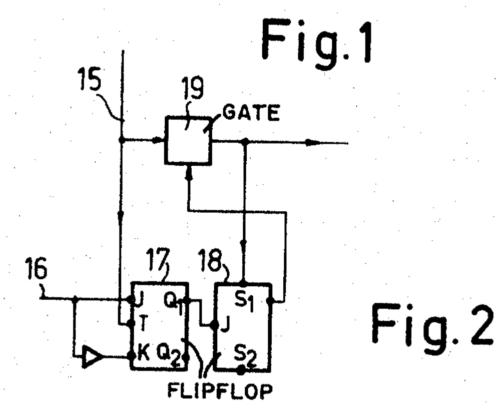
Figure 3:
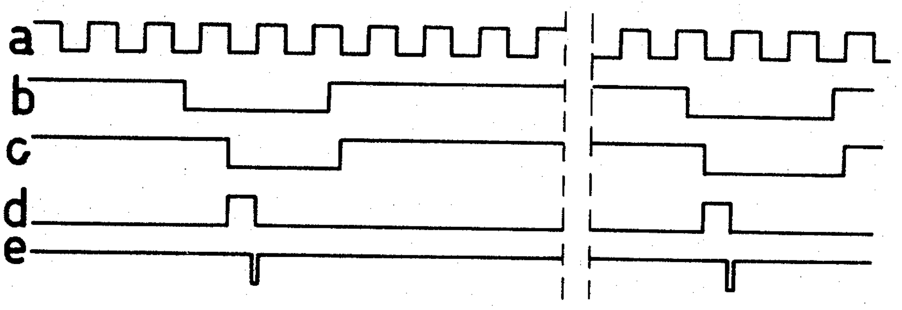
Figure 4:
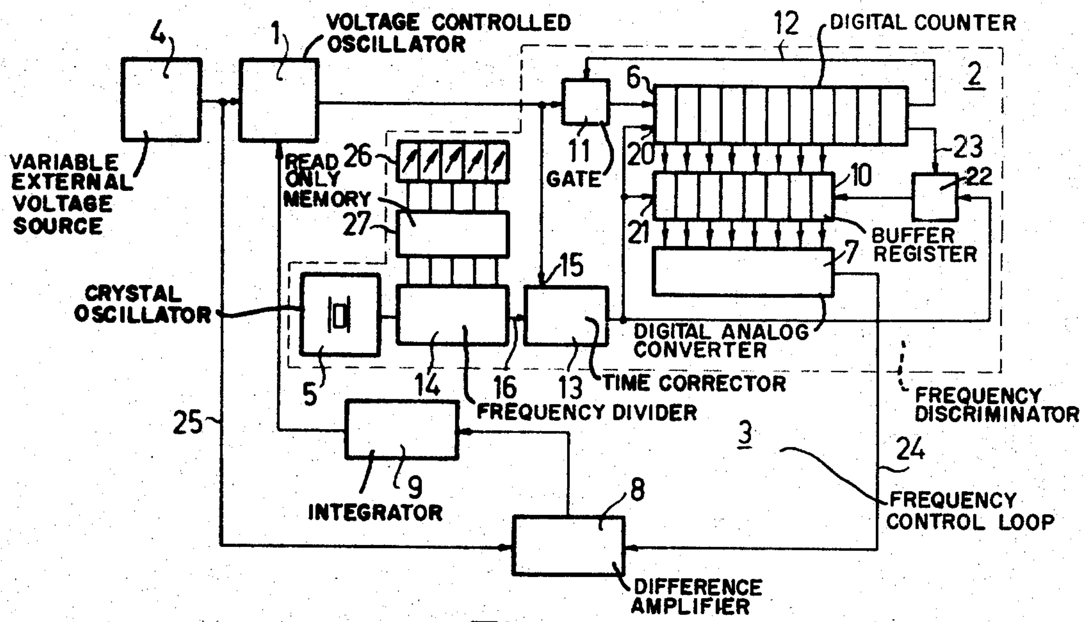
Figure 5:
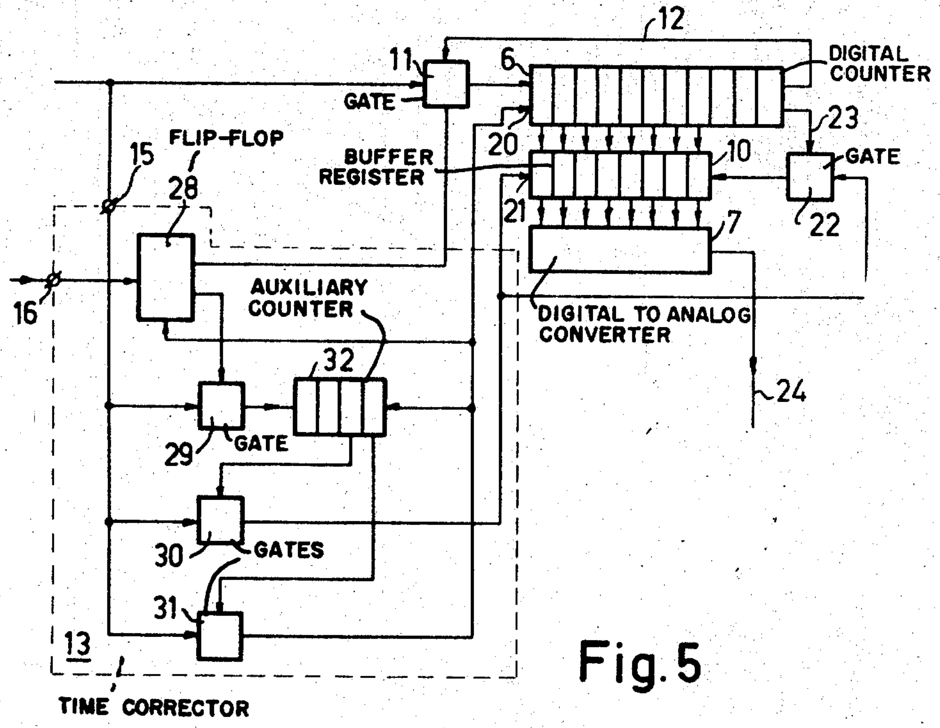
Figure 6:
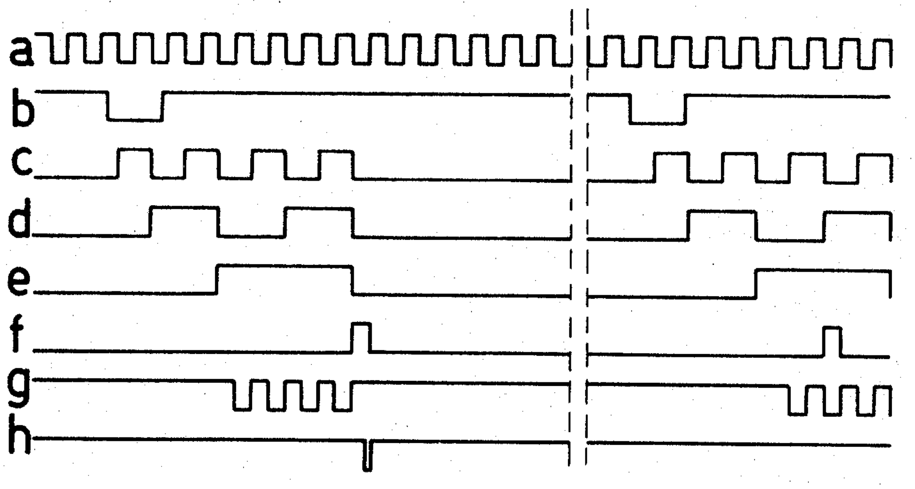
Figure 7:
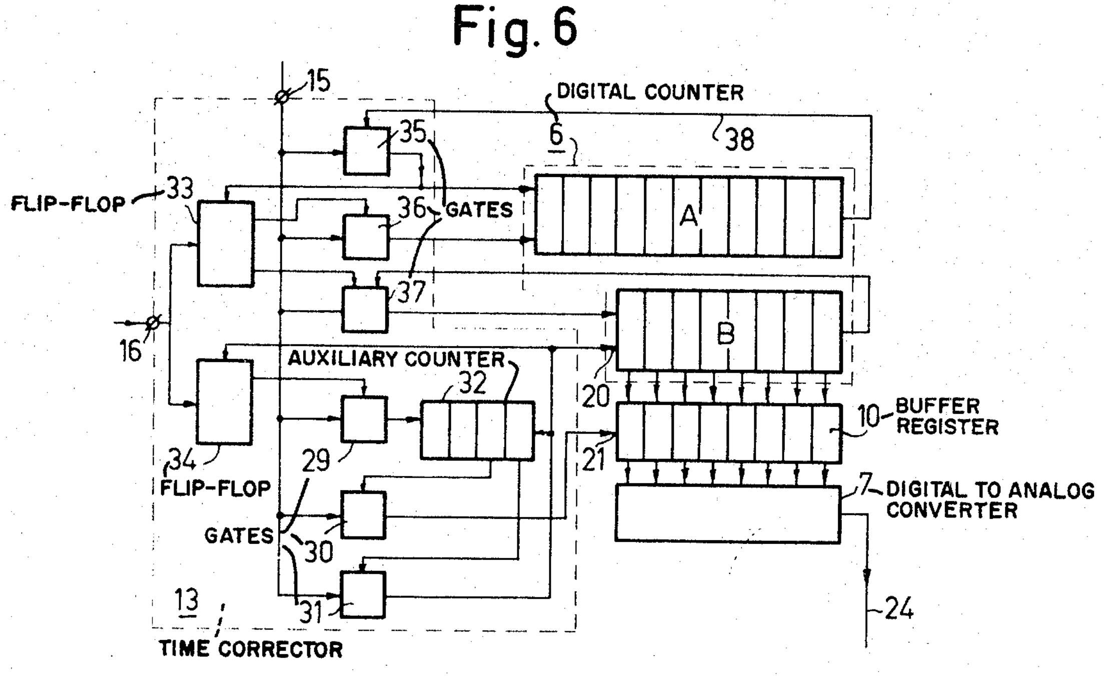
Figure 8:
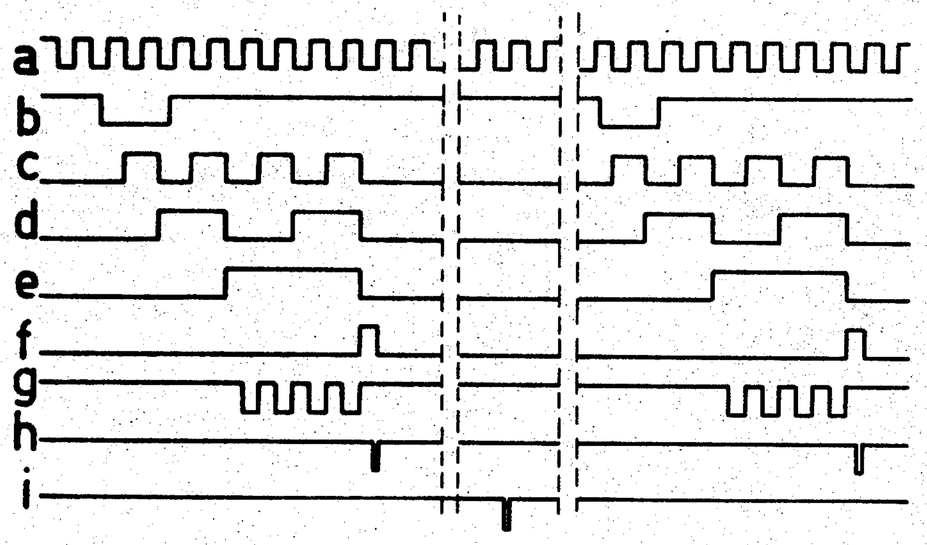

In order that the invention may be readily carried into effect, some embodiments thereof will now be described in detail by way of example with reference to the accompanying diagrammatic drawings, in which:

FIG. 1 shows a possible embodiment of the frequency generator according to the invention, FIG. 2 shows a possible embodiment of a time corrector to be used in the frequency generator according to FIG. 1, FIG. 3 shows a number of time diagrams, to explain the operation of the frequency generator shown in FIG. 1, FIG. 4 shows a further possible embodiment of the frequency generator according to the invention, FIG. 5 shows a possible embodiment of a digital frequency discriminator used in the frequency generator according to FIG. 1 or FIG. 4, FIG. 6 shows a number of time diagrams to explain the operation of the frequency discriminator shown in FIG. 5, FIG. 7 shows a further possible embodiment of the digital frequency discriminator which can be used in the frequency generator according to FIG. 1 or FIG. 4, and FIG. 8 shows a number of time diagrams to explain the operation of the frequency discriminator of FIG. 7.

In the frequency generator according to FIG. 1, the reference numeral 1 denotes a voltage-controlled oscillator constituted by a frequency controllable multivibrator and the reference numeral 2 denotes a frequency discriminator which, as is shown in the Figure, forms part of a frequency control loop 3 for stabilizing the oscillator output frequency with the aid of a crystal reference. Furthermore, the frequency generator comprises an external variable direct voltage source 4 for varying the oscillator output frequency as a function of a direct voltage value derived therefrom and applied to the stabilized oscillator 1. According to the invention, both the stringent and contradictory requirements concerning the frequency stability and the magnitude of the frequency variation range can be satisfied in such controllable frequency generators, if the frequency discriminator 2 incorporated in said frequency control loop 3 is constituted by at least a crystal oscillator 5 and a digital counter 6 which is adapted to continuously count the output pulses from one of the said oscillators 1, 5 during consecutive counting cycles whose duration is determined by a gating signal derived from the output signal of the other oscillator, as well as a digital-to-analog converter 7 coupled to said counter 6 to produce an output signal every time at the end of a counting cycle. The magnitude and polarity of said output signal are determined by the magnitude and direction of the mean value of the deviation measured during said counting cycle of the frequency to be stabilized relative to a fixed discriminator centre frequency characterized by a given counter content, and if the frequency control loop 3 is furthermore provided with a difference amplifier 8 to which the output voltage from the digital-to-analog converter 7 and the direct voltage value supplied by the external direct voltage source 4 are applied to obtain a difference signal which after integration in an integrator 9 is applied as a frequency correction signal to the voltage-controlled oscillator 1.

In the embodiment shown in FIG. 1, counter 6 comprises 11 flipflops, the first eight of which are connected via a buffer register 10 to the digital-to-analog converter 7. The counting pulse input of counter 6 is constituted by a gate 11 to which an output signal from the counter is applied via a lead 12, which output signal causes the gate 11 to pass the counting pulses as long as the counting content is not zero. The control functions such as the transfer of the counter content in buffer register 10 and the reset of the counter to the initial position are every time effected at the end of a counting cycle by means of a control pulse from a control pulse train which is generated in a time corrector 13 starting from said gating signal and said counting pulses.

In the embodiment shown in FIG. 1, the counting pulses are derived from crystal oscillator 5 and the gating signal, which determines the duration of the counting cycle is derived with the aid of a frequency divider 14 from the output signal from voltage controlled oscillator 1. The counting pulses and the gating signal are shown for the purpose of illustration in FIGS. 3*a* and 3*b*, respectively, and these signals are applied to the pulse counter 15 and the gating signal input 16 of said time corrector 13 which for completeness' sake is shown in greater detail in FIG. 2. This time corrector comprises two flipflops 17 and 18 and a gate 19 which are arranged in the manner shown in FIG. 2, the signal shown in FIG. 3*c* occurring at the $Q_1$ output of flipflop 17 and the signal shown in FIG. 3*d* occurring at the $Q_1$ output of flipflop 18. The control pulses shown in FIG. 3*c* occur at the output of gate 19 which pulses are now accurately related in time with the leading edge of a counting pulse, as is apparent from the Figure. Each of these control pulses is applied to a control pulse input 20 of counter 6 and to first and second control pulse inputs 21, 22 of buffer register 10. The last-mentioned control pulse input 22 is constituted by a gate, to which an output signal from counter 6 is applied via a lead 23, and this causes said gate to pass the control pulse not until after the counter content is at least smaller than a given value.

In the embodiment described above the operation of frequency discriminator 2 is based on the determination, with the aid of counter 6, of the possible deviation $\Delta t$ of the duration of the counting cycle determined by the gating signal relative to a nominal duration T of the counting cycle corresponding to the nominal output frequency $f_o$ of crystal oscillator 5. To this end the counter is reset to its initial position whenever a control pulse occurs at its input 20, said initial position being the maximum position in this embodiment. Starting from this maximum position, the counter counts back during the duration of the counting cycle. After this counting cycle, the counter has a given residual value. When the output frequency of crystal oscillator 1 is equal to the nominal frequency $f_1$, the counting cycle has the nominal duration T and said residual value is equal to the nominal residual value $R_o$. In case of a deviation $\pm\Delta t$ of the nominal duration T the difference between the then obtained residual value and the nominal residual value $R_o$ represents the deviation of the duration of the counting cycle relative to the nominal duration. This deviation $\pm \Delta t$ is approximately directly proportional to the frequency deviation $\pm \Delta f$ of the voltage-controlled oscillator relative to the nominal frequency $f_o$.

In the embodiment shown in FIG. 1, the counter comprises 11 flipflops and the residual value is expected in the first eight flipflops. The values characteristic of the counter are summarized in the table below.

TABLE I

| | 1 2 3 4 5 6 7 8 9 10 11 | |
|---|---|---|
| max. value | 1 1 1 1 1 1 1 1 1 1 1 | $=2^{11}-1 = 2047$ |
| max.residual value $R_{max}$ | 1 1 1 1 1 1 1 1 0 0 | $=2^{8}-1 = 255$ |
| nominal residual value $R_o$ | 0 0 0 0 0 0 0 1 0 0 0 | $=2^{7} = 128$ |
| minimum residual value $R_{min}$. | 0 0 0 0 0 0 0 0 0 0 0 | $=0$ |

As this Table shows, the nominal frequency, in this case the nominal duration of the counting cycle, requires 2,047−128 = 1,919 pulses to be counted so as to come to the nominal residual value $R_o$. If 127 fewer pulses are counted, the residual value is $R_{max}$ and this value is representative of a deviation in duration of the counting cycle corresponding to the largest positive frequency deviation of 127/1919 (≈ 6.62 percent) which can be measured.

If 128 more pulses are counted, the minimum residual value $R_{min}$ is reached and this value is representative of a deviation in duration of the counting cycle corresponding to the largest negative frequency deviation 128/1,919 (≈ 6.67 percent) which can be measured.

At the end of the counting cycle, counter 6 is reset to its initial position (maximum position) by the control pulse occurring at its control pulse input 20. Immediately before this, buffer register 10 is reset to its zero position by the control pulse applied via gate 22 to the buffer register, while the control pulse occurring at control pulse input 21 causes the residual value present in counter 6 to be transferred to the buffer register as soon as the buffer register is reset to its zero position.

Gates 11 and 22 form part of an upper limit and a lower limit supervision, respectively. Thus gate 11 prevents counting pulses from being applied to counter 6, when this counter is in its zero position, and gate 22 prevents buffer register 10 from being reset to zero position when the residual value to be transferred from counter 6 is larger than $R_{max}$. In that case gate 22 remains closed, because counter 6 does not provide any output voltage at its output lead 23.

In the described embodiment, voltage source 4 may be constituted for example by a phase control loop in which a direct control voltage is generated with the aid of a phase-sensitive detector, which voltage is representative of the phase deviation of the output signal from voltage-controlled oscillator 1 relative to a reference signal. Voltage source 4 may alternatively be constituted by a manually adjustable controllable direct voltage source. An alternating voltage may be superimposed on the direct voltage value supplied by this direct voltage source, and its amplitude modulation is then converted into a corresponding frequency modulation with accurately fixed centre frequency.

In the embodiment shown in FIG. 1, the deviation in duration of the period of the output frequency of voltage-controlled oscillator 1 is measured. By reversing the polarity of digital-to-analog converter 7 having a fixed connection with buffer register 10, this converter provides a direct output voltage which is approximately directly porportional to the instantaneous frequency deviation. This frequency deviation is always equal to the sum total of a desired frequency deviation on the one hand, as is caused by the direct voltage applied by variable direct voltage source 4 to the voltage-controlled oscillator 1, and on the other hand of an unwanted frequency deviation caused by a variation of the oscillator frequency as a result of, for example, temperature influences. In order to eliminate this unwanted frequency deviation, the direct voltage corresponding to the total frequency deviation and occurring at the output of digital-to-analog converter 7 is applied via lead 24 to the circuit 8 constituted by a difference amplifier to which also the direct voltage corresponding to the desired frequency deviation and originating from variable direct voltage source 4 is applied via lead 25. The difference signal occurring at the output of circuit 8 is then representative of the unwanted frequency deviation, and this signal is applied as a frequency correction signal after integration in integrator 9 to the voltage-controlled oscillator 1.

Since the discriminator centre frequency is determined by a given counter content and thus cannot drift while also the discriminator curve is fixed due to the fact that the counting pulses applied to counter 6 are derived from a crystal oscillator, the frequency generator has the important advantage tha the accuracy of the stabilization control and the frequency range within which voltage-controlled oscillator 1 can be varied in frequency as a function of the direct voltage derived from direct voltage source 4 may be particularly large.

As already noted herein, the deviation in period duration instead of the frequency deviation is measured in the embodiment shown in FIG. 1. Since an approximation in the form of $1 - \Delta \approx (1/1 + \Delta$ is used, the discriminator curve is not purely linear, which is, however, no drawback for many uses.

Simultaneously with the large frequency variation range which can thus be realized and the high stability, the embodiment shown in FIG. 1 has the additional important advantage that a frequency synthesizer can be made in a very simple manner from the frequency generator. More particularly it is only necessary to this end that frequency divider 14 is provided with the adjusting members denoted by 26 in FIG. 1 for, for example, adjustment in decades of the frequency division ratio of the divider.

FIG. 4 shows a further possible embodiment in which the parts corresponding to those in FIG. 1 have the same reference numerals. This embodiment largely corresponds to that of FIG. 1. It also includes a voltage-controlled oscillator 1, a variable direct voltage source 4 and a frequency correction loop 3 including a digital frequency discriminator 2, a difference amplifier 8 and an integrator 9.

The embodiment described is distinguished from that of FIG. 1 in that the functions of voltage-controlled oscillator 1 and crystal oscillator 5 are mutually exchanged, which means that the gating signal is derived with the aid of frequency divider 14 from the output signal from crystal oscillator 5, while the counting pulses applied via gate 11 to counter 6 are derived from voltage-controlled oscillator 1. As a result it is achieved that in this embodiment the discriminator curve has a purely linear variation because the frequency deviation instead of the deviation in period duration is measured.

Since the direct voltage/frequency characteristic of the discriminator has a linear variation, the advantage, important for some uses, is obtained in that variable voltage source 4 may be calibrated in frequency when it is, fro example, a manually adjustable controllable direct voltage source.

When an alternating voltage is superimposed on te direct voltage value provided by this controllable direct voltage source, a frequency modulation corresponding to the amplitude modulation of this alternating voltage is also realized in this embodiment, while the centre frequency is fixed, but at the same time the important advantage is obtained that the frequency range covered by the frequency modulation may be particularly large while maintaining a linear relationship between amplitude-and frequency modulation.

It is possible to make a frequency synthesizer of this embodiment, but in that case it is necessary that the divisional ratio of the frequency divider 14 is adjusted with the aid of a read-only memory 27 which is controlled by the adjusting members 26 in such a manner that the relationship between the adjusted value and the output value is reciprocal.

In the embodiments according to FIGS. 1 and 4, the counting cycles follow each other without intervals. This is of special advantage when, for example, the means frequency is to be measured of a frequency-modulated signal. In fact, intervals between the counting cycles may lead to unwanted mixing products between the modulation frequency and the frequency of the counting cycles. The transfer of the residual value of counter 6 to buffer register 10 requires a certain time when using the embodiments described hereinbefore. This time duration is mainly determined by the sum of the delay periods of each flipflop of the counter. This may be compensated for by forming the counter as a synchronous counter. It is, however, simpler to maintain the non-synchronous counter 6 of digital discriminator 2 and to add an auxiliary counter. Such an embodiment employing an auxiliary counter is partly shown in FIG. 5. In this Figure the parts corresponding to those of FIG. 1 and 4 have the same reference numerals. The embodiment shown in FIG. 5 also includes a counter 6, a buffer register 10, a digital-to-analog converter 7 and the gates 11 and 22. However, this embodiment is mainly distinguished by its time corrector 13 which is constituted in this case by a switching flipflop 28, three gates 29, 30 and 31 and the aforementioned auxiliary counter 32. Its operation may be explained as follows with reference to the time diagram shown in FIG. 6.

The counting pulses which have a high pulse repetition frequency in connection with the desired high counting rate, are shown in FIG. **6*a* and are applied on the one hand to gate 11 and on the other hand via counting pulse input 15 of time corrector 13 to the gates 29, 30 and 31 present therein. Gates 29 and 11 are controlled with the aid of switching flipflop 28 which renders the normally cosed gate 29 conducting in its first switching state for the counting pulses which are then applied to auxiliary counter 32, and which in its second switching state opens gate 11 instead of gate 29, so that the counting pulses are applied to counter 6. Switching flipflop 28 is set to its first switching state by the gating signal shown in FIG. 6*b* which determines the duration of the counting cycle and which is applied via gating signal input 16 of time corrector 13 to switching flipflop 28 which then causes the counting pulses to be counted by auxiliary counter 32.**

Thus, the auxiliary counter takes over the counting function from counter 6 for a short period at the commencement of a counting cycle so that it becomes possible to transfer the residual value present as a result of the preivous counting cycle in counter 6 to buffer register 10 without it being necessary in spite of the high counting rate to introduce intervals between the consecutive counting cycles. In the embodiment shown, the auxiliary counter comprises four flipflops so that a maximum of eight counting pulses can be counted. The output sigansl from the first, second. third and fourth flipflops of the auxiliary counter are shown in FIGS. 6*c*, 6*d*, 6*e* and 6*f*, respectively.

During the first four counting pulses which are counted by the auxiliary counter, counter 6 can become stable after termination of the previous counting cycle. As soon as the auxiliary counter has counted the fourth counting pulse, the third flipflop of the auxiliary counter provides the output signal shown in FIG. 6*e*. This signal is applied to gate 30, which is thereby opened for the counting pulses which then constitute the control signal shown in FIG. 6*g*. This control signal is applied to buffer register 10 on the one hand via control pulse input 21 and on the other hand via gate 22, which register then transfers the residual value present in counter 6 on the condition that this residual value is at least $\leq R_{max}$. As soon as the auxiliary counter has counted the eight counting pulses, the fourth flipflop of the auxiliary counter provides the output signal shown in FIG. 6*f*. This signal is applied to gate 31 which is thereby opened for a short period, while the control pulse shown in FIG. 6*h* occurs at the output of this gate. This control pulse is applied to control pulse input 20 of counter 6 which is thereby reset to its initial position. In this embodiment, the initial position is equal to the maximum counting position minus eight, for already eight pulses have been counted with the aid of auxiliary counter 32. The control pulse applied to control pulse input 20 of counter 6 is also applied to auxiliary counter 32 on the one hand, which is thereby reset to its zero position, and to switching flipflop 28 on the other hand, which is thereby set to its second switching state, while the counting pulses are applied to counter 6 via gate 11. Counter 6 counts down. At the end of the counting cycle, switching flipflop 28 is reset to its first switching state by the gating signal then occurring at the gating signal input of time corrector 13, and the procedure is repeated while the residual value present in counter 6 is transferred in buffer register 10 in the manner described above.

In the embodiment described hereinbefore, the frequency discriminator includes a counter 6 which is constituted by a single counter and in which the residual value which is expected in a part of this counter is expressed in percent of th input frequency. However, a different method may be employed in which counter 6 comprises two individual counters, one of which exclusively counts the residual value. Such a digital frequency discriminator which can advantageously be used in the frequency generator according to the invention is shown in Fig. 7. Again corresponding parts have the same reference numerals. As the Figure shows, this emboidment again comprises a counter 6, a ubffer register 10, a digital-to-analog converter 7 and a time corrector 13. The latter again comprises an auxiliary counter 32, and three gates 29, 30 and 31. However, this embodiment is distinguished in that counter 6 is constiuted by two individual counters which are denoted by A and B in the Figure. In connection with this deviating embodiment of counter 6, time corrector 13 is additionally provided with two switching flipflops 33 and 34 and with three extra gates 35, 36 and 37.

The operation is based on the following principle. During the counting cycle, whose duration T is determined by the gating signal, the counting pulses are firstly applied to counter A whose initial position is equal to the value $n = 0$, and whose maximum position is equal to the value $n = (fo - \Delta f/T)$. When counter A has reached this maximum value, it is reset to its initial position and counting is continued with the aid of counter B whose initial position is equal to the value $n$ $32 - \Delta f/T$. When the pulse repetition frequency of the counting pulses is equal to $fo$, counter B will have reached exactly the residual value $n = 0$ at the end of the counting cycle. In case of a deviation of the counting pulse repetition frequency of $+\Delta f$ or $-\Delta f$ the residual value of counter B will become equal to $n = +\Delta f/T$ or $n = -\Delta f/T$.

With reference to the time diagrams shown in FIG. 8, the operation may be described as follows.

The counting pulses shown in FIG. 8*a* are applied via counting pulse input 15 of time corrector 13 to the gates 29, 30, 31 and 35, 36 and 37 present therein. The gating signal which determines the duration T of the counting cycle is shown in FIG. 8b and is applied via gating signal input 16 of time corrector 13 to the two switching flipflops 33 and 34 which are thereby set to their first switching state. In this switching state, only gates 36 and 29 are opened for the counting pulses which are therefore applied to counter A and auxiliary counter 32. At the commencement of the counting cycle, thsee two counters have the value $n = 0$, while counter B has a value which indicates the residual value found as a result of the previous counting cycle. The auxiliary counter comprises four flipflops so that this counter can thus count a maximum of eight counting pulses. The output signals then provided by the first, second, third and fourth flipflops are shown in FIGS. 8*c*, 8*d*, 8*e* and 8*f*, respectively. During the first four counting pulses counted by auxiliary counter 32, counter B can become stable after termination of the previous counting cycle. As soon as the auxiliary counter has counted the fourth counting pulse, the third flipflop of the auxiliary counter provides the output signal shown in FIG. 8*e*. This signal is applied to gate 30 which is thereby opened for the counting pulses then constituting the control signal shown in FIG. 8*g*. This control signal is applied to control signal input 21 of buffer register 10 and causes the residual value present in counter B to be transferred in the buffer register. As soon as the auxiliary counter has counted the eight counting pulses, the fourth flipflop of this counter provides the output signal shown in FIG. 8*f*. This signal is applied to gate 31 which is thereby opened for a short period, so that the control pulse shown in FIG. 8*h* occurs at the output of this gate. The control pulse is applied to control pulse input 20 of counter B which is thereby set to its initial position ($n = \Delta t/T$). This control pulse is also applied to auxiliary counter 32 on the one hand, which is thereby reset to its zero position and on the other hand to flipflop switch 34 which is thereby set to its second switching state. The latter is of no further influence. Counter A still counts the counting pulses and continues to do so until this counter has reached its maximum value $n = (fo - \Delta t/T)$. At that instant counter A provides an output pulse which is applied via lead 38 to gate 35 and causes this gate to be opened for a short period so as to generate a control pulse which resets counter A to its initial position and which sets switching flipflop 33 to its second switching position, causing gate 37 instead of gate 36 to be opened for the counting pulses so that counter B continues counting. Counter B counts down and contiues to do so until the gating signal applied to the gating signal input sets the switching flipflops 33 and 34 again in their first switching position and the procedure is repeated with the residual value present in counter B being transferred in buffer register 10.

Together with the linear discriminator curve, a stable centering frequency and a large control range also obtained in this embodiment, it has the additional advntage important for some uses that the frequency deviation can be optionally measured directly in Hz. More particularly it is only necessary for this purpose that the duration of the counting cycle determined by the gating signal is equal to 1 second.

When the frequency generator according to the invention use is made of the frequency discriminator shown in FIG. 7 it requires only slight modification to change this frequency generator into a frequency synthesizer. In fact, when counter A therein is formed as an adjustable divider which is started at the value $n = \Delta/T$ and which, upon reaching the adjusted value $n = fo/T$ starts counter B at the initial value $n = -\Delta/T$, the frequency discriminator has an adjustable centre frequency. At T = 1 second, $f_0$ is then equal to the adjusted value and the residual value is equal to the deviation in Hz of the input frequency relative to the adjusted frequency.

What is claimed is:

1. A controllable wide range frequency generator comprising a voltage-controlled oscillator, a control loop for stabilizing the output frequency of said voltage controlled oscillator, a crystal oscillator coupled to said control loop to provide reference signals, an external variable voltage source, means connecting said external voltage source to said voltage controlled oscillator to vary the stabilized output frequency of said oscillator over a large frequency range as a function of direct voltage from said external voltage source applied to said voltage controlled oscillator, said control loop comprising a frequency discriminator to produce signals representing deviations between the frequency of said voltage controlled oscillator and the frequency of said crystal oscillator, said frequency discriminator comprising a digital counter continuously counting the output pulses from one of the oscillators during consecutive counting cycles, means for producing gating signals from the output of the oscillator not supplying said digital counter to determine the duration of said consecutive counting cycles, and a digital-to-analog converter coupled to said digital counter to produce said frequency deviation signals at the end of each counting cycle, the magnitude and polarity of said frequency deviation signals corresponding to the magnitude and direction of the mean value of the deviation measured during said counting cycles of the frequency to be stabilized relative to a fixed discriminator center frequency characterized by a given counter content, a difference signal means coupled to the digital-to-analog converter of said frequency discriminator and said external voltage source to produce a signal corresponding to the difference between said frequency deviation signal and the direct voltage of said external voltage source, and means for integrating said difference signal to produce a frequency correction for said voltage-controlled oscillator.

2. A frequency generator as claimed in claim 1, wherein said gating signal is generated with the aid of a frequency divider connected to the output of the voltage-controlled oscillator, the output pulses being derived from the crystal oscillator.

3. A frequency generator as claimed in claim 1, wherein said gating signal is generated with the aid of a frequency divider connected to the crystal oscillator output, the output pulses being derived from the voltage-controlled oscillator.

4. A frequency generator as claimed in claim 2, wherein the divisor of said divider is directly adjustable with the aid of decade switches.

5. A frequency generator as claimed in claim 3, wherein the divisor of said divider is adjustable with the aid of a read-only memory which is controlled by decade switches.

6. A frequency generator as claimed in claim 1, wherein said counter is constituted by a single counter which is started every time at the commencement of the counting cycle T from its maximum position characterizing the discriminator centre frequency, said counter counting down during the period of the counting cycle, the output pulses applied to the counter so as to determine a residual value which is representative of the mean value of the measured frequency deviation, said residual value being transferred after termination of the counting cycle to a buffer register connected to the digital-to-analog converter.

7. A frequency generator as claimed in claim 1, wherein said counter is constituted by two counters the first of which is started at the commencement of the counting cycle T from its zero position, which first counter upon reaching the value $n = (fo - \Delta f/T)$ starts the second counter from the value $n = \Delta f/T$ so as to determine a residual value which is representative of the measured frequency deviation relative to the discriminator centre frequency $f_o$, said residual value being transferred after termination of the counting cycle to a buffer register connected to the digital-to-analog converter.

8. A frequency generator as claimed in claim 7, wherein said first counter is formed as an adjustable divider.

9. A frequency generator is claimed in claim 1, further comprising a time corrector to which both the gating signal and the output pulses are applied, said corrector being responsive output to said pulses and gating signals to produce control pulses which are applied to said counter and to a buffer register so as to control the transfer of said residual value which is representative of the measured frequency deviation relative to the discriminator center frequency and to reset said counter to its initial position.

10. A frequency generator as claimed in claim 9, wherein said time corrector comprises an auxiliary counter which is rendered active for a given short period at the commencement of the counting cycle so as to generate said control pulses for transferring the residual value from said counter to said buffer register and for resetting said counter to its initial position.

* * * * *

PO-1050
(5/69)

UNITED STATES PATENT OFFICE
CERTIFICATE OF CORRECTION

Patent No. 3,753,141 Dated August 14, 1973

Inventor(s) CORNELIS JOHANNES VAN ELK, JACOB FREDERIK RAATGEVER, JAN GIJSBERT DIRK VAN DER LEE, AND ALBERTUS MARINUS MORRIEN It is certified that error appears in the above-identified patent and that said Letters Patent are hereby corrected as shown below:

Section [75] Inventors: "Jan Gijsbert Morrien" should read

--Jan Gijsbert Dirk Van Der Lee and Albertus Marinus Morrien--.

Signed and sealed this 20th day of November 1973.

EAL)
test:

WARD M.FLETCHER,JR.
testing Officer

RENE D. TEGTMEYER
Acting Commissioner of Patents

PO-1050
(5/69)

UNITED STATES PATENT OFFICE
CERTIFICATE OF CORRECTION

Patent No. 3,753,141 Dated August 14, 1973

Inventor(s) CORNELIS J. VAN ELK ET AL

It is certified that error appears in the above-identified patent and that said Letters Patent are hereby corrected as shown below:

On the Title Page Section [75] Inventors:"Raaigever"

should read --Raatgever--.

Signed and sealed this 9th day of April 1974.

(SEAL)
Attest:

EDWARD M.FLETCHER,JR.
Attesting Officer

C. MARSHALL DANN
Commissioner of Patents